United States Patent
Gupta et al.

(10) Patent No.: US 9,860,993 B2
(45) Date of Patent: Jan. 2, 2018

(54) GRID AND NANOSTRUCTURE TRANSPARENT CONDUCTOR FOR LOW SHEET RESISTANCE APPLICATIONS

(71) Applicant: CHAMP GREAT INT'L CORPORATION, Eden Island (SC)

(72) Inventors: Rahul Gupta, Milpitas, CA (US); Florian Pschenitzka, San Francisco, CA (US); Karl Pichler, Admont (AT)

(73) Assignee: CAM Holding Corporation, Tortola (VG)

(*) Notice: Subject to any disclaimer, the term of this patent is extended or adjusted under 35 U.S.C. 154(b) by 199 days.

(21) Appl. No.: 14/703,830

(22) Filed: May 4, 2015

(65) Prior Publication Data

US 2015/0313022 A1    Oct. 29, 2015

Related U.S. Application Data (62) Division of application No. 13/287,881, filed on Nov. 2, 2011, now abandoned.

(60) Provisional application No. 61/409,412, filed on Nov. 2, 2010.

(51) Int. Cl.
| | |
|---|---|
| *B05D 3/00* | (2006.01) |
| *H05K 3/10* | (2006.01) |
| *H01L 51/00* | (2006.01) |
| *H01L 51/52* | (2006.01) |
| *B05D 5/00* | (2006.01) |

(52) U.S. Cl.
CPC .............. *H05K 3/10* (2013.01); *B05D 5/00* (2013.01); *H01L 51/003* (2013.01); *H01L 51/0021* (2013.01); *H01L 51/5215* (2013.01); *H01L 2227/326* (2013.01); *Y10T 156/10* (2015.01)

(58) Field of Classification Search
CPC combination set(s) only.
See application file for complete search history.

(56) References Cited

U.S. PATENT DOCUMENTS

2011/0273085 A1* 11/2011 Garbar ................ H01L 31/1884
                                                                  313/509

FOREIGN PATENT DOCUMENTS

WO    WO 2009086161 A1 *  7/2009   ........ H01L 31/1884

* cited by examiner

*Primary Examiner* — Vishal I Patel
(74) *Attorney, Agent, or Firm* — Paul Bendemire (57) ABSTRACT

Transparent conductors and methods of forming same are provided. A transparent conductor can include a nanostructure layer and a low sheet resistance grid disposed on a transfer film surface having an acceptable level of surface roughness. The presence of the low sheet resistance grid lowers the sheet resistance of the transparent conductor to an acceptable level. After release of the transparent conductor from the transfer film, the surface roughness of the transparent conductor will be at least comparable to the surface roughness of the transfer film.

19 Claims, 6 Drawing Sheets

GRID AND NANOSTRUCTURE TRANSPARENT CONDUCTOR FOR LOW SHEET RESISTANCE APPLICATIONS

CROSS-REFERENCE TO RELATED APPLICATIONS

This application is a divisional of U.S. application Ser. No. 13/287,881, having a filing date of Nov. 2, 2011, now pending, which claims the benefit of U.S. Provisional Patent Application No. 61/409,412 filed Nov. 2, 2010, both of which are incorporated herein by reference in their entirety.

BACKGROUND

Technical Field

This invention is related to transparent conductors, in particular to transparent conductors having high transparency, low sheet resistance and low surface roughness.

Description of the Related Art

Transparent conductors refer to thin conductive films coated on high-transmittance insulating surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

However, transparent conductors such as Indium-Tin Oxide (ITO) and Aluminum doped Zinc Oxide (AZO) have practical limitations in the lowest economically or practically obtainable sheet resistance. Where low sheet resistance ITO or AZO based thermal conductors are needed, other physical (transmission properties, deposition time, flexibility) or fiscal (processing time, overall cost of materials) properties are adversely impacted.

Applications such as organic light emitting diode (OLED) lighting, photovoltaic (PV) cells, and organic photovoltaic (OPV) may benefit from the use of transparent conductors having sheet resistances of <5 Ohms/square or even <1 Ohm/square. Traditional methods of achieving low sheet resistance transparent conductors include the use of a fine patterned low sheet resistance grid with a sputtered transparent conductor or conducting polymer to form a composite structure having the desired sheet resistance. In addition to opacity concerns with high conductor density grids, many composite metal grid transparent conductors have an inherently three dimensional surface, the presence of which can result in compromised performance of electronic devices using such transparent conductor through excessive leakage current or shorting.

Accordingly, there remains a need in the art to provide transparent conductors having desirable electrical, optical and mechanical properties, in particular, transparent conductors having minimal surface roughness to reduce or eliminate leakage current and shorting, and having reduced sheet resistance while retaining acceptable optical and mechanical properties.

BRIEF SUMMARY

An example transparent conductor method is described herein. A low sheet resistance grid is deposited on a planar transfer film surface according to a grid pattern. A nanostructure layer is also deposited on the transfer film surface according to a nanostructure layer pattern. The low sheet resistance grid and the nanostructure layer form a coplanar transparent conductor surface. The resultant transparent conductor has high transparency, low sheet resistance, and minimal surface roughness.

An example transparent conductor is also described herein. The transparent conductor includes a low sheet resistance grid and a nanostructure layer forming a transparent conductor having a coplanar surface. The resultant transparent conductor has high transparency, low sheet resistance, and minimal surface roughness.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

The transparent conductors and transparent conductor methods described herein are presented in the form of various embodiments. It should be understood that variations are possible within each of these embodiments and in other embodiments not specifically described for the sake of clarity and/or to avoid redundancy within this disclosure. Additionally, the order and extent of deposition of the various layers and structures disclosed herein can be varied, altered, divided, or subdivided to meet varying performance specifications. The general format presented will provide, in making reference to all included illustrated embodiments in FIGS. 1-6, a detailed description of each of the components used within the illustrative embodiments provided herein. A detailed description of each illustrated embodiment follows the detailed component descriptions.

The various layers discussed may comprise one or more independently applied layers. Different layers may be applied uniformly (e.g. with the same pattern or not patterned) or non-uniformly (e.g. with different superimposed patterns).

Transparent Conductor

As used herein, the term "transparent conductor" refers to the structures and materials that form any electrically conductive, optically transparent or translucent, structure. An example transparent conductor may comprise a low sheet resistance grid (e.g., a metal grid structure) combined with a nanostructure layer including one or more conductive nanostructures (e.g., silver nanowires or graphene or carbon nanotubes or TCO nano-particles) and/or disposed within an organic polymer matrix (e.g., doped poly(3,4-ethylenedioxythiophene) or PEDOT, poly-aniline, polypyrole or other conducting polymers). A transparent conductor may include the physical structures and electrical devices and layers that provide desirable physical and/or electrical properties, for example electrical properties such as low sheet resistance, high transparency, and a planar exposed surface.

The presence of the low sheet resistance grid within the transparent conductor reduces the sheet resistance of the transparent conductor by providing a network of relatively low resistance pathways throughout the relatively high resistance nanowire (or conducting polymer, or carbon nanotubes, etc.) layer. Using such a structure, sheet resistances of less than about 10 ohms/sq; less than about 5 ohms/sq; less than about 1 ohms/sq; less than about 0.5 ohms/sq; or less than about 0.1 ohms/sq are possible. The ability to manufacture large size, transparent conductors having a sheet resistance of less than about 10 ohms/sq; less than about 5 ohms/sq; less than about 1 ohms/sq; less than about 0.5 ohms/sq; or less than about 0.1 ohms/sq makes possible their use as in OLED devices, OLED lighting devices and photovoltaic cell applications.

The transparency of the transparent conductor is a function, at least in part, of the structures and materials used in the construction of the transparent conductor. For example, where a highly conductive or low sheet resistance transparent conductor is desired, increasing the concentration of conductive structures such as metal nanowires or graphene elements within the nanostructure layer may improve the conductivity or lower the resistance. However, the additional conductive structures may adversely impact (i.e. lower) the transparency of the transparent conductor. Using both a low sheet resistance grid 115 deposited at least in part in conjunction with a nanostructure layer 120 as described herein reduces the concentration of nanostructures in the nanostructure layer and provides a transparent conductor having a light transmission of about 80% or greater; about 85% or greater; or about 90% or greater.

Physical properties can also affect the performance of the transparent conductor. For example, a high surface roughness can increase the incidence of current leakage and internal shorting experienced by the OLED or OPV devices fabricated on such transparent conductors. Minimizing the surface roughness of the transparent conductor can reduce leakage current and internal shorting to levels acceptable for use in high performance applications such as OLED display devices, OLED lighting devices and photovoltaic devices. A transparent conductor having a surface roughness of about 50 nanometers (nm) or less peak-to-peak; about 30 nm or less peak-to-peak; or about 10 nm or less peak-to-peak can provide acceptable levels of leakage current and minimal internal shorting.

Transfer Film

The transfer film 105 provides the substrate for construction by deposition of the various structures and layers forming the transparent conductor. In various embodiments, and dependent upon the manufacturing process employed, the transfer film 105 can be rigid, semi-rigid, or flexible. For example, a rigid transfer film may be amenable to a conveyor line type production process, while a semi-rigid or flexible transfer film may be better suited for a preferred reel-to-reel type production process.

The layers and structures deposited on the transfer film are generally in a pattern rather than randomly across the transfer film. At least two methods exist for providing the pattern on the transfer film, pre-patterning and post-patterning. In pre-patterning, the various layers, components and structures are precisely deposited in their predetermined locations on the transfer film with little or no subsequent processing required. In post-patterning, the various layers, components and structures are distributed more or less uniformly across the transfer film followed by a removal (or post processing) step where the layers, components and structures improperly deposited or inappropriately placed are removed. The provision of the low sheet resistance grid, the nanostructure layer, or both the low sheet resistance grid and the nanostructure layer as a solution, liquid, slurry, or polymer matrix makes possible their controlled deposition on and removal from the transfer film surface.

Pre-patterning is accomplished using printing (or similar) techniques permitting the precise deposition and positioning of the various layers, components and structures on the transfer film. Examples of printing methods include direct or offset printing (e.g. gravure), flexographic printing, ink-jet, thermal transfer and screen printing. An example pre-patterned production method is provided by passing the transfer film beneath a print head depositing the various layers, components and structures based upon a digitally encoded, machine executable instruction set.

Post-patterning is accomplished using photo-lithographic, laser ablation, or other similar techniques where the various layers, components and structures are more or less individually and uniformly distributed across the transfer film, for example using vacuum sputtering, evaporation or wet-coating deposition techniques. Selective portions of the individually applied layers, components and structures are then removed, for example using an etchant. Combinations of pre-patterning and post-patterning are possible—some layers, components and structures on the transfer film may be deposited using a pre-pattern, while other layers, components and structures are formed using post-pattern techniques. The low sheet resistance metal grid could also be co-laminated or embedded pre-fabricated sheet of metal grid.

The transfer film 105 type is not particularly limited so long as it can: (a) support the deposition of the various layers and structures forming the transparent conductor; (b) be separated from the various layers and structures forming the transparent conductor; (c) has a smooth, planar, surface having an acceptable surface roughness; and (d) be compatible with the chemicals used in the deposition and processing of various layers. Since the transfer film is removed to expose the surface of the transparent conductor, the transfer film can be optically clear, transparent, translucent or even opaque.

Since the transparent conductor is built on the surface 110 of the transfer film 105, the finished surface roughness of the transparent conductor will be similar to the surface roughness of the transfer film 105. As a result, the transfer film may be selected, at least in part, based upon the allowable surface roughness of the transparent conductor. For example, to provide a transparent conductor having about 50 nanometers (nm) or less peak-to-peak surface roughness; about 30 nm or less peak-to-peak surface roughness; or about 10 nm or less peak-to-peak surface roughness, a transfer film 105 having a surface 110 with about 50 nm or less peak-to-peak surface roughness; about 30 nm or less peak-to-peak surface roughness; or about 10 nm or less peak-to-peak surface roughness, respectively, may be selected.

Another consideration is the ability to detach or release the transparent conductor from the surface 110 of the transparent conductor 105. To improve, enhance, or assist the release of the transparent conductor from the transfer film 105 may be enhanced through the use of one or more release agents. A suitable release agent should permit the easy release of the transfer film 105 from the transparent conductor without damaging or otherwise adversely altering the physical or electrical properties of the transparent conductor. Release agents are usually based on a material having low surface energy, including but not limited to: silicon based polymers, fluorinated polymers, starch, and the like. One or more release agents may be incorporated within the transfer film itself, for example by chemical or physical bonding to the surface or within the structure of the transfer film 105. Various release agents may be externally activated, for example through photochemical activation upon exposure to ultraviolet (UV) light or through thermal activation upon exposure to elevated temperatures.

Low Sheet Resistance Grid

The low sheet resistance grid 115 provides a low resistance pathway or a network of pathways for current flow, distribution and/or collection within at least the nanostructure layer 120. In addition to providing these low resistance pathways, the low sheet resistance grid 115 may also provide a measure of physical strength to the transparent conductor. A transparent conductor having such physical strength may be advantageous for example where larger size transparent conductors are used, for example transparent conductors used in large format OLED displays, OLED lighting devices and photovoltaic devices.

The low sheet resistance grid 115 includes any type of electrically conductive structure having appropriate electrical and physical properties, including metallic, non-metallic, or composite structures containing a combination of metallic and non-metallic structures. Examples of low sheet resistance grids 115 include, but are not limited to fine metal mesh (e.g., copper mesh, silver mesh, aluminum mesh, steel mesh, etc.)—deposited e.g. by sputtering or evaporation with post-patterning, preferably e.g. screen-printed metal pastes (e.g. Ag-paste), an embeddable fine metal wire or a printable solution containing one or more residual low resistance components.

The physical size and/or configuration of the low sheet resistance grid 115 is based in whole or in part upon meeting any specified electrical (e.g., sheet resistance) and physical (e.g., surface roughness and/or light transmission) requirements. The size and routing of the conductors forming the low sheet resistance grid 115 form a grid pattern used to deposit or otherwise form at least a portion of the low sheet resistance grid 115 on the transfer film. In some embodiments, the width of the elements forming the low sheet resistance grid 115 can range from about 1 micron to about 300 microns. In some embodiments, the height of the elements forming the low sheet resistance grid can range from about 100 nm to about 100 microns. The open distance between the elements forming the low sheet resistance grid can range from about 100 microns to about 10 mm.

Deposition of the low sheet resistance grid 115 can be accomplished using pre-patterning, post-patterning or any combination thereof. Examples of pre-patterned, printed, low sheet resistance grids 115 include, but are not limited to, printed silver paste grids, printed copper paste grids, micro- or nano-particle paste grids, or similar conductive paste grids. An example post-patterned low sheet resistance grid 115 is provided by the use photo-lithographic development of a previously applied conductive film to produce the low sheet resistance grid 115. Other example post-patterned low sheet resistance grids 115 include, but are not limited to, overall deposition via printing, evaporation, sputtering, electro-less or electrolytic plating, or solution processing followed by patterning via photo-lithography, screen printed resist, screen printed etchant, standard etch, laser etch, and adhesive lift off stamp.

The low sheet resistance grid may have any two-dimensional or three-dimensional geometry, shape or configuration needed to achieve a desired sheet resistance while retaining acceptable optical properties. While a greater grid density (i.e., greater low resistance pathway cross sectional area) may reduce the overall sheet resistance of the transparent conductor, a high grid density may increase the opacity of the transparent conductor to unacceptable levels. Thus, the pattern selection and physical properties of the low sheet resistance grid 115 is, at times, may represent a compromise based at least in part upon the minimizing the sheet resistance of the transparent conductor while not increasing the opacity of the transparent conductor to an unacceptable degree.

The low sheet resistance grid 115 can have any fixed, geometric or random pattern capable of providing an acceptable sheet resistance. For example, low sheet resistance grid 115 patterns can include regular or irregular width geometric arrangements such as perpendicular lines, angled lines (e.g., forming a "diamond" pattern), and parallel lines. Other patterns can use curved or arc-shaped conductors to achieve complex patterns having uniform or non-uniform sheet resistance, for example where the transparent conductor is intended for a three dimensional application. Where appropriate, for example in some OLED series interconnected cells and in forming photovoltaic modules, the low sheet resistance grid 115 can be formed using two or more patterns, for example a grid formed using parallel lines bounded by a larger pattern, such as a hexagon or rectangle. In another embodiment, the low sheet resistance grid 115 may be a comb-like structure linking series interconnected thin film photovoltaic stripes.

Nanostructure Layer

The nanostructure layer 120 is an conductive, optically transparent or translucent material that may be pre-patterned and at least partially deposited as a solution, liquid, or liquid slurry on the transfer film 105, the low sheet resistance grid 115, or both the transfer film 105 and the low sheet resistance grid 115. The nanostructure layer 120 can include one or more conductive polymers, for example a conductive polymer containing conductive nanowires (e.g., silver nanowires) or conductive structures (e.g., graphene or carbon nanotubes). Examples of conductive polymer based nanostructure layers 120 can be found in co-pending U.S. application Ser. No. 11/504,822, filed Aug. 14, 2006 and entitled "Nanowires Based Transparent Conductors" which is incorporated by reference herein in its entirety.

In some instances, the nanostructure layer 120 can be pre-patterned and applied to the transfer film 105 by direct printing deposition. Non-limiting examples of direct print deposition of the nanostructure layer include screen printing, gravure printing, flexographic printing, ink-jet printing, transfer-printing and the like. An example describing a screen printing technique can be found in co-pending U.S. application Ser. No. 12/380,294, filed Feb. 25, 2009, entitled "Method and Composition for Screen Printing of Conductive Features" which is incorporated by reference herein in its entirety. An example describing an inkjet printing technique can be found in co-pending U.S. application Ser. No. 12/380,293, filed Feb. 25, 2009, entitled "Methods and Compositions for Ink Jet Deposition of Conductive Features" which is incorporated by reference herein in its entirety.

In other instances, the nanostructure layer 120 can be applied or otherwise disposed on the transfer film 105 by coating the transfer film in a uniform manner followed by post-patterning using lithographic techniques, laser ablation, and the like.

In at least some embodiments, the nanostructure layer 120 can include one or more additional layers, for example one or more conductive polymer layers, one or more thin-sputtered transparent conductor layers, and/or one or more buffer layers. The additional layers can include materials such as zinc or titanium oxide which may provide good electron or hole injection or extraction and/or electron or hole blocking functionality. In at least some instances the additional layers can be deposited based in whole or in part upon a pattern, for example a hole transport layer deposited per a hole transport pattern, an electron transport layer deposited per an electron transport pattern, a hole inhibition layer deposited per a hole inhibition pattern, and/or an electron inhibition layer deposited per an electron inhibition pattern.

In other instances, the additional layer can include a conducting polymer effective in promoting electrical contact with an OLED or OPV stack. The nanostructure layer 120 and any additional layers can be deposited in any order, sequence, or structure to provide acceptable functionality. Such rearrangement of the nanostructure layer 120 and any additional layers should be considered as embodiments included within the scope of this disclosure.

In one instance, the nanostructure layer 120 may comprise a plurality of metal nanowires embedded in a matrix. As used herein, the term "matrix" refers to a solid-state material into which the metal nanowires are dispersed or embedded. The nanowires may be randomly arranged or aligned or preferentially aligned along one or more axes. The nanowires may be disposed in a uniform or non-uniform manner within the matrix. The nanowires may or may not extend from one or more surfaces formed by the nanostructure layer 120. The matrix is a host for the metal nanowires and provides physical form to the nanostructure layer 120. The matrix may be selected or configured to protect the metal nanowires from adverse environmental factors, such as corrosion and abrasion. In particular, the matrix significantly lowers the permeability of potentially corrosive elements such as moisture, trace amount of acids, oxygen, sulfur and the like, all of which can potentially degrade the nanowires embedded in the matrix.

In addition, the matrix contributes to the overall physical and mechanical properties to the nanostructure layer 120. For example, the matrix can promote the adhesion of the nanostructure layer 120 to neighboring layers within the transparent conductor. The matrix also contributes to the flexibility of the nanostructure layer 120 and to the overall flexibility of the transparent conductor. Flexible matrices make it possible to fabricate transparent conductors in a low-cost, high throughput process. Moreover, the optical properties of the nanostructure layer 120 can be tailored by selecting an appropriate matrix material. For example, reflection loss and unwanted glare in the transparent conductor can be effectively reduced by using a matrix of a desirable refractive index, composition and thickness.

In at least some instances, the matrix is an optically clear material. A material is considered optically clear if the light transmission of the material is at least 80% in the visible region (400 nm-700 nm). The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles). In certain embodiments, the matrix, and hence the nanostructure layer 120 is about 10 nm to 5 µm thick, about 20 nm to 1 µm thick, or about 50 nm to 200 nm thick. In other embodiments, the matrix has a refractive index of about 1.3 to 2.5, or about 1.35 to 1.8.

In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetheramides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinyl idene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the matrix is an inorganic material. For example, a sol-gel matrix based on silica, mullite, alumina, SiC, MgO—$Al_2O_3$—$SiO_2$, $Al_2O_3$—$SiO_2$, MgO—$Al_2O_3$—$SiO_2$—$Li_2O$ or a mixture thereof can be used.

In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, polypyroles and polydiacetylenes.

In other embodiments, the polymer matrix may be a viscosity modifier, which serves as a binder that immobilizes the nanostructures on a substrate. Examples of suitable viscosity modifiers include hydroxypropyl methylcellulose (HPMC), methyl cellulose, ethyl cellulose, xanthan gum, polyvinyl alcohol, carboxy methyl cellulose, and hydroxy ethyl cellulose.

As used herein the nanostructure layer 120 can refer at least to the combination of the network layer of metal nanowires and the matrix. Since conductivity is achieved by electrical charge transfer from one metal nanowire to another, sufficient metal nanowires must be present in the nanostructure layer 120 to reach an electrical transfer threshold and display adequate overall levels of conductivity. As discussed above the nanostructure layer 120 can include other materials, particles, or structures to impart one or more desirable electrical properties or characteristics. The surface conductivity of the nanostructure layer 120 is inversely proportional to its sheet resistance, which can be measured using known methods in the art.

The threshold loading level refers to a percentage of the metal nanowires by weight after loading of the nanostructure layer 120 at which the nanostructure layer 120 has a surface resistivity of no more than about $10^6$ ohms/sq. The threshold loading level depends on factors such as the aspect ratio, the degree of alignment, degree of agglomeration and the resistivity of the metal nanowires. In at least some embodiments, all or a portion of the nanowires present in the nanostructure layer 120 can be aligned to provide one or more desirable electrical properties. Such configurations are described in detail in U.S. application Ser. No. 11/871,721, filed Oct. 12, 2007, entitled "Functional Films Formed by Highly Oriented Deposition of Nanowires" which is incorporated by reference herein in its entirety.

The mechanical and optical properties of the nanostructure layer 120 may be altered, compromised, or otherwise affected by a high solids loading (e.g., nanowires, scattering particles, and other particulate additives) therein. Advantageously, the high aspect ratios of the metal nanowires allow for the formation of a conductive network through the matrix at a threshold surface loading level preferably of about $0.05$ $\mu g/cm^2$ to about $10$ $\mu g/cm^2$, more preferably from about $0.1$ $\mu g/cm^2$ to about $5$ $\mu g/cm^2$ and more preferably from about $0.8$ $\mu g/cm^2$ to about $3$ $\mu g/cm^2$ for silver nanowires. These surface loading levels do not affect the mechanical or optical properties of the nanostructure layer 120. These values depend strongly on the dimensions and spatial dispersion of the nanowires. Advantageously, transparent conductors of tunable electrical conductivity (or surface resistivity) and optical transparency can be provided by adjusting the loading levels of the metal nanowires.

In some instances, one or more light scattering or light directing materials may be dispersed in all or a portion of the nanostructure layer 120. Typically, the optical transparence or clarity of the nanostructure layer 120 can be quantitatively defined by parameters including light transmission and haze. "Light transmission" refers to the percentage of an incident light transmitted through a medium. In various embodiments, the light transmission of the nanostructure layer 120 is at least 80% and can be as high as 98%. Performance-enhancing layers, such as an adhesive layer, anti-reflective layer, anti-glare layer, may further contribute to reducing the overall light transmission of the nanostructure layer 120. In various embodiments, the light transmission of the nanostructure layer 120 can be at least 50%, at least 60%, at least 70%, or at least 80% and may be as high as at least 91% to 99%. Examples of light directing materials include, but are not limited to, gratings, micro-lens arrays, embossed structures, and the like.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In various embodiments, the haze of the transparent conductor is no more than 10%, no more than 8%, or no more than 5% and may be as low as no more than 2% to 0.5%. Haze can also be artificially created within the nanostructure layer, for example through the addition of scattering particles within the matrix or within the nanostructure layer itself. A discussion of haze producing and light scattering particles can be found in co-pending U.S. application Ser. No. 12/960,316, filed Dec. 3, 2010, and entitled "Nanostructure-Based Transparent Conductors Having Increased Haze and Devices Comprising the Same" which is incorporated by reference herein in its entirety.

Planarizing Layer

The planarizing layer 130 is disposed over all or a portion of the transparent conductor, and provides an optically transparent, or translucent medium disposed between at least a portion of the transparent conductor and a substrate 140. In some instances the planarizing layer 130 reduces surface irregularities thereby smoothening the surface to which it is applied. In other instances the planarizing layer can eliminate surface irregularities, thereby planarizing the surface to which it is applied.

The planarizing layer 130 can include, but is not limited to, one or more layers having the same or differing properties. In some instances, the planarizing layer 130 may include an adhesive layer and one or more optional layers, for example one or more light-scattering, light-directing, charge transport, or charge inhibiting layers. In other instances the planarizing layer 130 can include at least one layer affecting the optical properties of the transparent conductor 100, for example an anti-reflection layer. In yet other instances the planarizing layer 130 is partially or completely opaque, for example where a very smooth patterned conductor on a final carrier metal foil is desired.

The planarization layer 130 is applied to at least a portion of the surface of the transparent conductor opposite the transfer film 105. For example, at least a portion of the planarization layer may include an adhesive beneficial when applying the transparent conductor 100 to a smooth substrate 140 with or without the use of an additional adhesive layer disposed between the substrate and the planarizing layer 130 (e.g., liquid, film, pressure sensitive adhesive film, thermal-cure, UV-cure, etc.).

To accommodate the various surface features within the transparent conductor, the planarization layer 130 can be relatively thick when compared for instance to the low sheet resistance grid 115 and/or nanostructure layer 120. For example, the overall thickness of the planarization layer 130 can be about 10 µm to about 50 µm; about 5 µm to about 30 µm; or about 1 µm to about 20 µm.

Non-limiting examples of adhesives useful in providing all or a portion of the planarization layer 130 include, but are not limited to, epoxy-based adhesives, acrylic-based adhesives, phenol-based adhesives, and siloxane-based adhesives. In at least some embodiments, the planarization layer 130 can be a photo patternable transfer adhesive. In other instances, at least a portion of the planarization layer 130 includes a photo-curable compound, for example an ultraviolet (UV) photo-curable adhesive. In other embodiments, at least a portion of the planarization layer 130 includes a thermally curable compound, for example a heat curable adhesive.

In at least some embodiments one or more materials enhancing the performance or functionality of the planarizing layer 130 in particular or the transparent conductor 100 overall may be disposed or dispersed within all or a portion of the planarizing layer 130. In some instances the performance of the transparent conductor 100 may be enhanced through the addition of light scattering or light directing materials within the adhesive layer. Examples of light scattering materials include, but are not limited to, haze producing materials. Examples of light directing materials include, but are not limited to, gratings, micro-lens arrays, embossed structures, and the like.

For example, one or more haze producing materials such as scattering particles, patterned scattering structures, or similar materials may be disposed within all or a portion of the planarizing layer 130. The introduction of haze producing materials to the adhesive layer may improve the optical quality of the transparent conductor, for example by reducing or eliminating glare or reflection caused at least in part by the transparent conductor, the underlying substrate, or any combination thereof. Haze producing and/or light directing structures disposed within the planarizing layer 130 can be beneficial in OLED or thin film photovoltaic devices to provide light output coupling (for OLEDs) or light input coupling (for photovoltaics).

In some instances, the planarizing layer 130 may electrically couple at least a portion of the transparent conductor 100 with the underlying substrate 140. In other instances, the planarizing layer 130 may electrically decouple at least a portion of the transparent conductor 100 from the underlying substrate 140.

The planarizing layer 130 may be applied uniformly or semi-uniformly across all or a portion of the low sheet resistance grid 115, the nanostructure layer 120, or both the low sheet resistance grid 115 and the nanostructure layer 120. Where the planarizing layer 130 is applied uniformly or semi-uniformly, the planarizing layer may be post patterned. The planarizing layer 130 may be applied uniformly to at least partially planarize irregular surface features of the low sheet resistance grid 115 and the nanostructure layer 120, for example by leveling any surface irregularities where the low sheet resistance grid 115 extends above the nanostructure layer 120. In some instances, the planarizing layer 130 may be applied to only a portion, for example the perimeter, of the transparent conductor.

The planarizing layer 130 may be pre-patterned prior to application across all or a portion of the low sheet resistance grid 115, the nanostructure layer 120, or both the low sheet resistance grid 115 and the nanostructure layer 120. Pre-patterning of the adhesive may also permit the planarization of irregular surface features in the low sheet resistance grid 115 and the nanostructure layer 120, for example by "filling" low lying nanostructure layer 120 areas with adhesive to match the surfaces of the projecting low sheet resistance grid 115.

Isolators

Isolators 205 are electrically non-conductive regions disposed in, on, or about the transfer film 105. Such areas or regions can take the form of voids, or structures comprised of insulating or semi-conducting materials. The isolators 205 extend partially or completely through one or more layers forming the transparent conductor and serve to selectively divide or subdivide the transparent conductor into electrically isolated regions.

The isolators 205 may be pre-patterned and applied to the transfer film 105 by direct printing deposition. Non-limiting examples of direct print deposition of the isolators 205 include, but are not limited to, screen printing, gravure printing, flexographic printing, ink-jet printing, transfer-printing and the like.

In other instances, the isolators 205 may be applied or otherwise disposed on the transfer film 105 by coating the transfer film in a uniform manner. Where a uniform isolator layer 205 is applied, post-patterning is possible using lithographic techniques, laser ablation, and the like.

Protective Film

A protective film 305 may be applied to the uppermost layer of the transparent conductor opposite the transfer film 105. The protective film 305 can be rigid, semi-rigid, or flexible dependent upon the inherent rigidity of the underlying transfer film 105. In some instances protective film 305 is disposed in direct contact with the planarizing layer 130.

When reel-to-reel production techniques are employed to manufacture the transparent conductor, the protective film 305 can assist in minimizing damage to the planarizing layer 130, for example as the transparent conductor is spooled on the take-up spool. When the planarizing layer 130 at least partially comprises an adhesive, the protective film 305 may be disposed on the surface of the planarizing layer 130 to prevent premature activation of the adhesive.

The protective film can both protect the uppermost layer and maintain the integrity of the uppermost layer surface, for example where the uppermost layer is planarized. The protective film 305 can be any flexible material that can be physically, chemically, or statically detachably attached to the uppermost layer of the transparent conductor. The protective film can be optically transparent, translucent, or opaque. The protective film 305 can include, but is not limited to a flexible polymeric compound such as a polyethylene film.

Illustrative Embodiments

FIGS. 1A through 1E depict a transparent conductor 100 including a low sheet resistance grid 115, a nanostructure layer 120, and a planarizing layer 130, according to an embodiment. The low sheet resistance grid 115 and the nanostructure layer 120 forming the transparent conductor 100 are deposited on a transfer film 105 having a surface 110. The low sheet resistance grid 115 and the nanostructure layer 120 collectively form the coplanar surface 125 of the transparent conductor 100. Being formed proximate the surface 110, the surface 125 has a surface roughness comparable to the surface roughness of the transfer film surface 110.

Figure 1A:
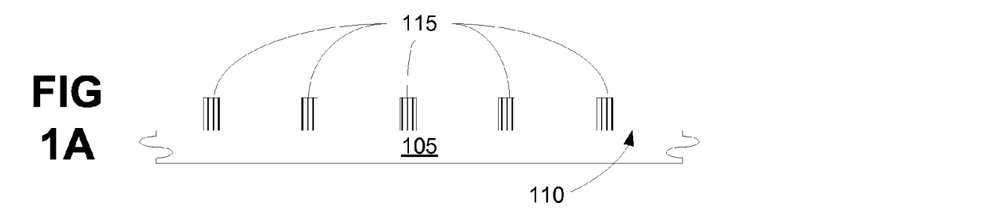
FIGS. 1A-1E depict a transparent conductor including a low sheet resistance grid, a nanostructure layer, and a planarizing layer, according to an embodiment described herein.

As depicted in FIG. 1A the low sheet resistance grid 115 is deposited or otherwise disposed across all or a portion of the surface 110. In some instances, the low sheet resistance grid 115 may be pre-patterned and disposed in final position using, for example, using screen printing or other similar printing technology. In other instances, the low sheet resistance grid 115 may be post-patterned for example using photo-lithographic techniques after being more or less uniformly deposited across all or a portion of the surface 110.

Figure 1B:
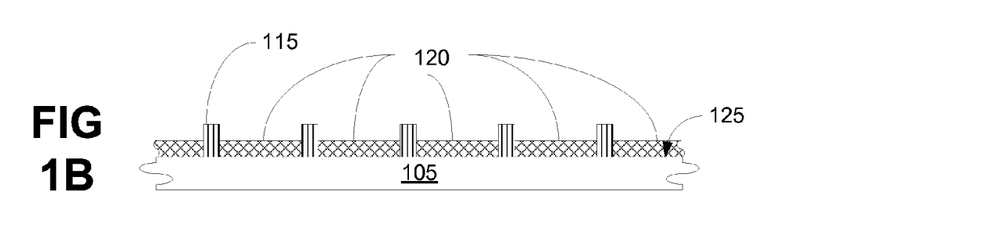

As depicted in FIG. 1B, a nanostructure layer 120 may be deposited or otherwise disposed across all or a portion of the surface 110 and the low sheet resistance grid 115, for example as a conductive polymer solution containing conductive metallic nanowires, after the deposition and patterning of the low sheet resistance grid 115. After deposition, the nanostructure layer 120 may be electrically coupled to all or a portion of the low sheet resistance grid 115.

As used herein, the term "electrically coupled" refers to any two or more devices that are capable of sustaining a regular or controlled intermittent flow of charge carriers, either holes or electrons. The flow of charge carriers between electrically coupled devices may occur either directly between the two or more devices or through one or more intervening structures, devices, or systems. For example, where the nanostructure layer 120 and the low sheet resistance grid 115 are "electrically coupled," charge carriers (i.e. electrons) may flow directly between the nanostructure layer 120 and the low sheet resistance grid 115.

In some instances, the nanostructure layer 120 may be pre-patterned and disposed in final position using, for example, using gravure printing, flexo printing, or other similar printing technologies. In other instances, the nanostructure layer 120 may be post-patterned for example using photo-lithographic techniques after being more or less uniformly deposited across all or a portion of the surface 110. As depicted in FIG. 1B, the low sheet resistance grid 115 and the nanostructure layer 120 combine to form a coplanar surface 125 proximate the surface 110.

Application of the low sheet resistance grid 115 and the nanostructure layer 120 in a manner promoting continuous or near continuous physical and electrical contact between the grid 115, nanostructure layer 120, and transfer film 105 produces, after release from the transfer film 105, a coplanar surface 125 with a roughness approximately equal to the surface roughness of the planar surface 110.

Physically bonding the low sheet resistance grid 115 with the nanostructure layer 120 improves the mechanical properties of the transparent conductor 100. For example, the resultant transparent conductor 100 is less brittle and less likely to crack when compared to transparent conductive oxides such as ITO and AZO. The improved mechanical properties of the transparent conductor 100 facilitates its use in the production of large scale transparent conductors such as those found in large scale OLED display devices, OLED lighting devices and photovoltaic devices.

The surface roughness of the coplanar surface 125 formed by the low sheet resistance grid 115 and the nanostructure layer 120 can be about 50 nm peak-to-peak or less; about 30 nm peak-to-peak or less; or about 10 nm peak-to-peak or less. A transparent conductor 100 having a low surface roughness minimizes the losses attributable to the presence of internal shorting or leakage currents within the end use device such as a OLED or photovoltaic device. Electrically coupling the low sheet resistance grid 115 and nanostructure layer 120 provides a transparent conductor 100 having a sheet resistance of less than about 10 ohms/sq; less than about 5 ohms/sq; less than about 1 ohms/sq; or less than about 0.1 ohms/sq.

Figure 1C:
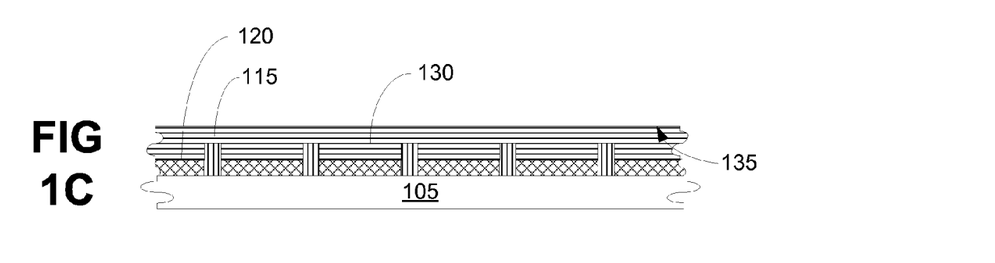

As depicted in FIG. 1C, a planarizing layer 130 can be deposited or otherwise disposed across all or a portion of the low sheet resistance grid 115 and the nanostructure layer 120. In some instances, the planarizing layer 130 can be pre-patterned, for example to "fill" low spots on the sometimes rough or irregular surface formed by the low sheet resistance grid 115 and the nanostructure layer 120. In other instances, for example as depicted in FIG. 1C, the planarizing layer 130 can be applied non-uniformly across the surface formed by the low sheet resistance grid 115 and the nanostructure layer 120 to provide a smooth or planar surface 135.

Figure 1D:
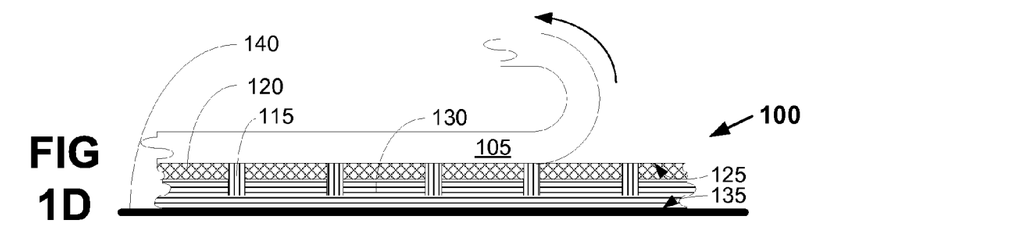

As depicted in FIG. 1D, the transfer film 105 is removed to expose the coplanar surface 125 formed by the low sheet resistance grid 115 and the nanostructure layer 120. In at least some instances, the transparent conductor 100 may be applied to the substrate 140 during the production process; for example, a flexible substrate 140 may be applied to the transparent conductor 100 using the reel-to-reel production process used to apply at least one of the low sheet resistance grid 115, the nanostructure layer 120, and the planarizing layer 130. The transfer film 105 can be removed prior to or after the attachment of the transparent conductor 100 to a substrate 140. To minimize the likelihood of damage to the transparent conductor 100, the transfer film 105 may be removed after attaching or bonding the transparent conductor 100 to the substrate 140.

In at least some instances, the transparent conductor 100 may be applied to the substrate 140 during the production process; for example, a flexible substrate 140 may be applied to the transparent conductor 100 using the reel-to-reel pro- duction process used to apply the low sheet resistance grid 115, the nanostructure layer 120, or the planarizing layer 130.

After removal of the transfer film 105, one or more final smoothing layers may be disposed on the coplanar surface 125 to provide additional functionality or to further protect the coplanar surface 125 from damage. Examples of smoothing layers can include, but are not limited to, a conducting polymer, an evaporated hole transport layer deposited per a hole transport pattern, an evaporated electron transport layer deposited per an electron transport pattern, an evaporated hole inhibition layer deposited per a hole inhi- bition pattern, an evaporated electron inhibition layer depos- ited per an electron inhibition pattern, an electron-blocking buffer layer, a hole-blocking buffer layer, and/or a conduct- ing polymer having desirable charge carrier extracting or injecting properties. The one or more final smoothing layers may be uniformly applied, post-patterned, or pre-patterned.

Figure 1E:
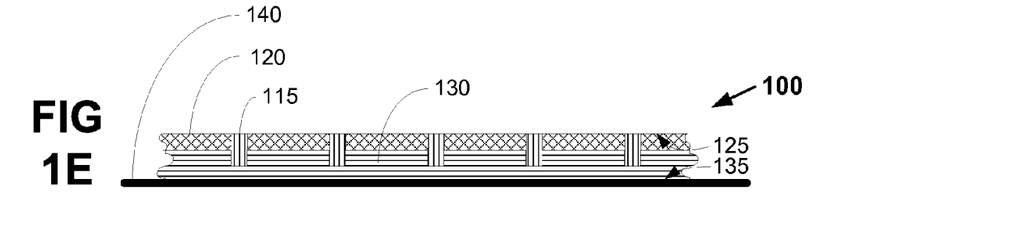

FIG. 1E depicts the transparent conductor 100, without transfer film 105, applied or otherwise bonded to a substrate 140 via the planarizing layer 130. The substrate 140 can include any rigid or flexible material, for example a rigid glass or a flexible plastic substrate may be used. The substrate 140 may be an exterior surface of a larger device such as an OLED display device, and OLED lighting device or a photovoltaic device.

FIGS. 2A through 2F depict a transparent conductor 200 including a low sheet resistance grid 115, a nanostructure layer 120, at least one isolator 205, and a planarizing layer 130. The inclusion of the at least one isolator 205 provides a plurality of electrically decoupled transparent conductors (identified as 200A, 200B, 200C in FIG. 2C) disposed within a single transparent conductor 200. The at least one isolator 205 provides an alternative to electrically separating the transparent conductor structure via pre- or post-patterning of the low sheet resistance grid 115 and/or nanostructure layer 120.

The low sheet resistance grid 115, the nanostructure layer 120, and the at least one isolator 205 are at least partially deposited on the surface 110 of the transfer film 105. The low sheet resistance grid 115, the nanostructure layer 120, and the at least one isolator 205 collectively form the coplanar surface 210 of the transparent conductor 200. Being formed proximate the surface 110, the coplanar sur- face 210 has a surface roughness comparable to the surface roughness of the transfer film surface 110.

Figure 2A:
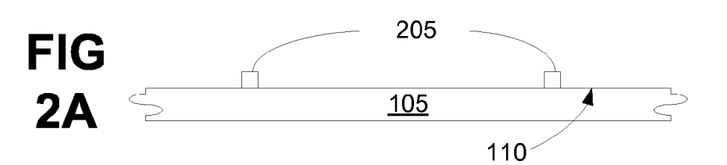
FIGS. 2A-2F depict a transparent conductor including an isolator, a low sheet resistance grid, a nanostructure layer, and a planarizing layer, according to an embodiment described herein.

As depicted in FIG. 2A, the at least one isolator 205 is deposited or otherwise disposed across all or a portion of the surface 110. In some instances, the at least one isolator 205 may be pre-patterned and disposed in final position using, for example, an ink-jet, screen, or similar printing technol- ogy. In other instances, the at least one isolator 205 may be post-patterned after being more or less uniformly deposited across all or a portion of the surface 110. Such post- patterning can use various techniques, for example photo- lithographic techniques, to provide any desired isolator pattern.

Figure 2B:
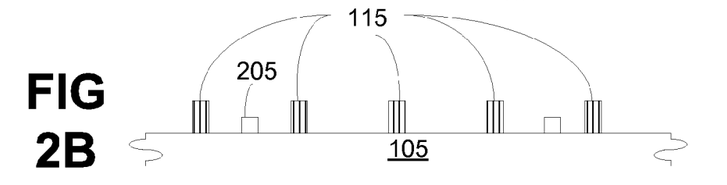

As depicted in FIG. 2B, the low sheet resistance grid 115 is deposited or otherwise disposed across all or a portion of the surface 110 and the at least one isolator 205. The low sheet resistance grid 115 may be pre-patterned and disposed in final position using, for example using screen printing, or similar technology. In other instances, the low sheet resis- tance grid 115 may be post-patterned for example using photo-lithographic techniques after being more or less uni- formly deposited across all or a portion of the surface 110 and the at least one isolator 205.

Figure 2C:
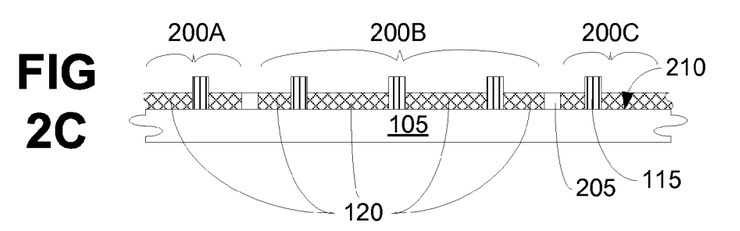

As depicted in FIG. 2C, a nanostructure layer 120 is deposited or otherwise disposed across all or a portion of the surface 110, the at least one isolator 205, and the low sheet resistance grid 115. The nanostructure layer 120 may be selectively electrically coupled to the low sheet resistance grid based upon the number and location of the at least one isolator 205. In some embodiments, the at least one isolator 205 can divide the transparent conductor in whole or in part to provide a plurality of electrically decoupled transparent conductors 200A, 200B and 200C.

The nanostructure layer 120 may be pre-patterned and disposed in final position using, for example using gravure printing, flexo printing, or other similar technologies. Deposition of the one or more isolators 205, the low sheet resistance grid 115 and the nanostructure layer 120 using methods or in a manner promoting continuous or near continuous physical and electrical contact between the constituent components can produce a transparent conductor 200 that, after release from the transfer film 105, provides the coplanar surface 210 which has a surface roughness approximately equal to the surface roughness of the surface 110.

Physically bonding the low sheet resistance grid 115 with the nanostructure layer 120 improves the mechanical properties of the transparent conductor 200. For example, the transparent conductor 200 is less brittle and less likely to crack when compared to transparent conductive oxides such as ITO and AZO. The improved mechanical properties of the transparent conductor 200 facilitates its use in the production of large scale transparent conductors such as those found in large scale OLED display devices, OLED lighting devices and photovoltaic devices.

The surface roughness of the coplanar surface 210 formed by the at least one isolator 205, the low sheet resistance grid 115 and the nanostructure layer 120 can be about 50 nm peak-to-peak or less; about 30 nm peak-to-peak or less; or about 10 nm peak-to-peak or less. A transparent conductor 200 having a low surface roughness minimizes the losses attributable to the presence of internal shorting or leakage currents within the end use device such as a OLED or photovoltaic device. Electrically coupling the low sheet resistance grid 115 with the nanostructure layer 120 provides a transparent conductor 200 having a sheet resistance of less than about 10 ohms/sq; less than about 5 ohms/sq; less than about 1 ohms/sq; or less than about 0.1 ohms/sq.

Figure 2D:
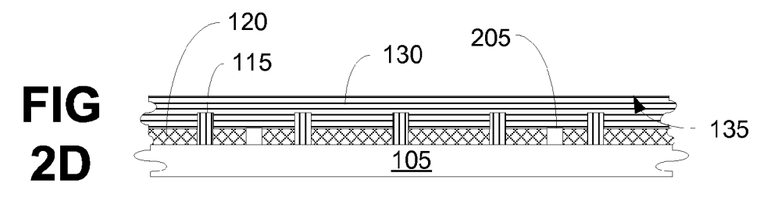

As depicted in FIG. 2D, a planarizing layer 130 is deposited across all or a portion of the surface formed by the at least one isolator 205, the low sheet resistance grid 115 and the nanostructure layer 120. In some instances, the planarizing layer 130 can be pre-patterned, for example to "fill" low spots on the sometimes rough or irregular surface formed by the at least one isolator 205, the low sheet resistance grid 115 and the nanostructure layer 120. In other instances, for example as depicted in FIG. 2D, the planarizing layer 130 can be applied in a non-uniform manner partially or completely across the surface formed by the at least one isolator 205, the low sheet resistance grid 115 and the nanostructure layer 120 to provide a planar surface 135.

Figure 2E:
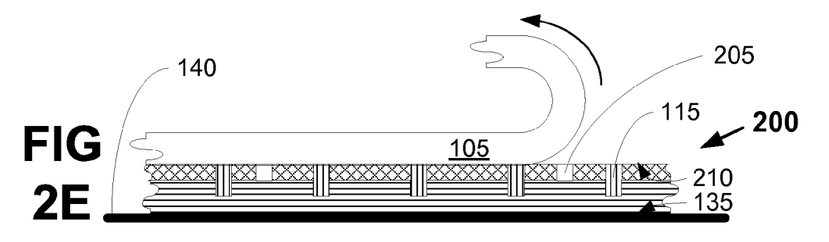

As depicted in FIG. 2E, the transfer film 105 is removed to expose the coplanar surface 210 provided by the low sheet resistance grid 115, the nanostructure layer 120, and the at least one isolator 205. In at least some instances, the transparent conductor 200 may be applied to the substrate 140 during the production process; for example, a flexible substrate 140 may be applied to the transparent conductor 200 using the reel-to-reel production process used to apply at least one of the at least one isolator 205, the low sheet resistance grid 115, the nanostructure layer 120, or the planarizing layer 130. The transfer film 105 can be released prior to or after the attachment of the transparent conductor 200 to a substrate 140. To minimize the likelihood of damage to the transparent conductor 200, the transfer film may be released after attaching the transparent conductor 200 to the substrate 140. After release of the transfer film, one or more additional layers may be disposed on the coplanar surface 210 to provide additional functionality or to further protect the coplanar surface 210 from damage.

Figure 2F:
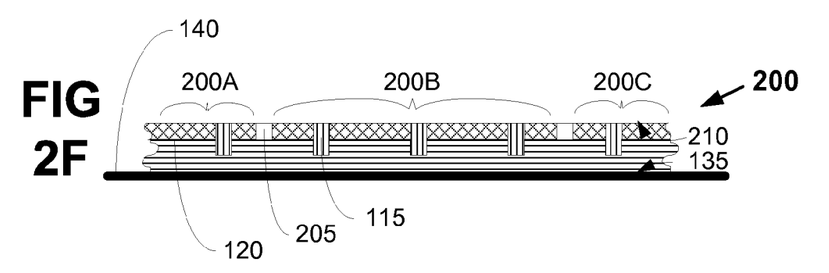

FIG. 2F depicts the transparent conductor 200, without transfer film 105, applied or otherwise bonded to a substrate 140 via the planarizing layer 130. The substrate 140 can include any rigid or flexible material, for example a rigid glass or a flexible plastic substrate may be used. The substrate 140 may be an exterior surface of a larger device such as an OLED display device, an OLED lighting device or a photovoltaic device.

The disposal of the at least one isolator 205 proximate the transfer film 105 reduces or eliminates the need for post-process placement of the isolators 205 via cutting or ablation of the coplanar surface 210 of the transparent conductor 200. Minimizing or eliminating the need for open channel type isolators cut into the coplanar surface 210 of the transparent conductor 200 maintains the integrity of the coplanar surface 210.

FIGS. 3A through 3F depict a transparent conductor 300 including a low sheet resistance grid 115, a nanostructure layer 120, and a planarizing layer 130 at least partially covered by a protective film 305 according to an embodiment. The low sheet resistance grid 115 and the nanostructure layer 120 forming the transparent conductor 300 are deposited on the surface 110 of the transfer film 105. The low sheet resistance grid 115 and the nanostructure layer 120 collectively form the coplanar surface 125 of the transparent conductor 300. Being formed proximate the surface 110, the coplanar surface 125 has a surface roughness comparable to the surface roughness of the transfer film surface 110.

In some instances, disposal of the protective film 305 across all or a portion of the planarizing layer 130 may reduce the likelihood of damage to the planarizing layer 130, for example where the transparent conductor 300 is produced using a reel-to-reel process. In other instances disposal of the protective film 305 across all or a portion of the planarizing layer 130 may reduce the likelihood of inadvertent activation of the planarizing layer 130, for example where the protective layer 305 is a UV opaque material and the planarizing layer 130 comprises at least in part a UV-activated adhesive.

Figure 3A:
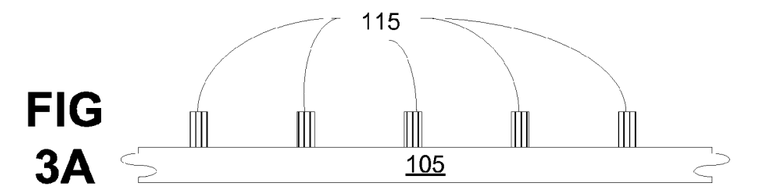
FIGS. 3A-3F depict a transparent conductor including a low sheet resistance grid, a nanostructure layer, a planarizing layer, and a protective film according to an embodiment described herein.

As depicted in FIG. 3A the low sheet resistance grid 115 is deposited or otherwise disposed across all or a portion of the surface 110. In some instances, the low sheet resistance grid 115 may be pre-patterned and disposed in final position using, for example using screen printing or other similar printing technology. In other instances, the low sheet resistance grid 115 may be post-patterned for example using photo-lithographic techniques after being more or less uniformly deposited across all or a portion of the surface 110.

Figure 3B:
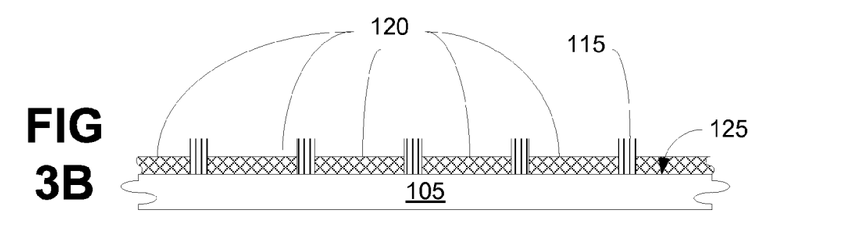

As depicted in FIG. 3B, a nanostructure layer 120 may be deposited or otherwise disposed across all or a portion of the surface 110 and the low sheet resistance grid 115. After deposition, the nanostructure layer 120 may be electrically coupled to all or a portion of the low sheet resistance grid 115.

In some instances, the nanostructure layer 120 may be pre-patterned and disposed in final position using, for example using gravure printing, flexo printing or other similar printing technologies. In other instances, the nanostructure layer 120 may be post-patterned for example using photo-lithographic techniques after being more or less uniformly deposited across all or a portion of the surface 110. As depicted in FIG. 3B, the low sheet resistance grid 115 and the nanostructure layer 120 form a coplanar surface 125 proximate to the planar surface 110.

Application of the low sheet resistance grid 115 and the nanostructure layer 120 in a manner promoting continuous or near continuous physical contact between the grid 115, nanostructure layer 120, and transfer film 105 produces, after release from the transfer film 105, the coplanar surface 125 having a surface roughness approximately equal to the surface roughness of the planar surface 110.

The combination of the low sheet resistance grid 115 and the nanostructure layer 120 makes possible the construction of transparent conductors having low sheet resistance and high transparency such as those useful in OLED displays, OLED lighting and photovoltaic applications. Transparent conductors having exposed or raised low sheet resistance grids (i.e., where the grid 115 and the nanostructure layer 120 are not coplanar) may experience an increased incidence of current leakage or shorting within the end use device. The surface roughness of the coplanar surface 125 formed by the low sheet resistance grid 115 and the nanostructure layer 120 can be about 50 nm peak-to-peak or less; about 30 nm peak-to-peak or less; or about 10 nm peak-to-peak or less. A transparent conductor 300 having a low surface roughness minimizes the losses attributable to the presence of internal shorting or leakage currents within the end use device such as OLED or photovoltaic devices. Electrically coupling the low sheet resistance grid 115 and nanostructure layer 120 provides a transparent conductor 300 having a sheet resistance of less than about 10 ohms/sq; less than about 5 ohms/sq; less than about 1 ohms/sq; or less than about 0.1 ohms/sq.

Physically bonding the low sheet resistance grid 115 with the nanostructure layer 120 improves the mechanical properties of the transparent conductor 300. For example, the transparent conductor 300 is less brittle and less likely to crack when compared to transparent conductive oxides such as ITO and AZO. The improved mechanical properties of the transparent conductor 300 facilitates its use in the production of large scale transparent conductors such as those found in large scale OLED display devices, OLED lighting devices and photovoltaic devices.

Figure 3C:
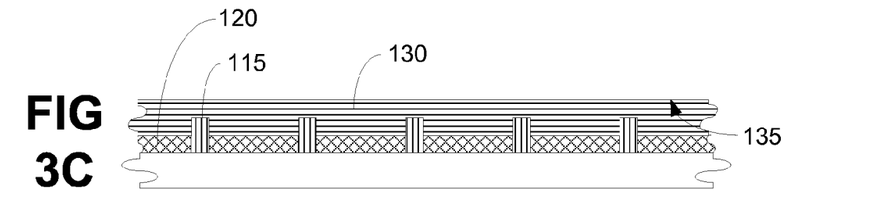

As depicted in FIG. 3C, a planarizing layer 130 can be deposited or otherwise disposed across all or a portion of the surface formed by the low sheet resistance grid 115 and the nanostructure layer 120. In some instances, the planarizing layer 130 can be pre-patterned, for example to "fill" low spots on the sometimes rough or irregular surface formed by the low sheet resistance grid 115 and the nanostructure layer 120 opposite the transfer film 105. In other instances, for example as depicted in FIG. 3C, the planarizing layer 130 can be applied non-uniformly across the surface formed by the low sheet resistance grid 115 and the nanostructure layer 120 to provide a smoothened or planar surface 135.

Figure 3D:
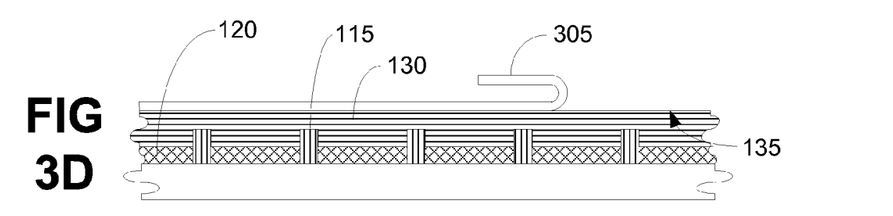

As depicted in FIG. 3D, a protective film 305 can be disposed across all or a portion of the exposed surface 135 of the planarizing layer 130. The protective film 305 can maintain the integrity and/or smoothness of the planarizing layer surface 135 until the transparent conductor 300 is applied to a substrate 140.

Figure 3E:
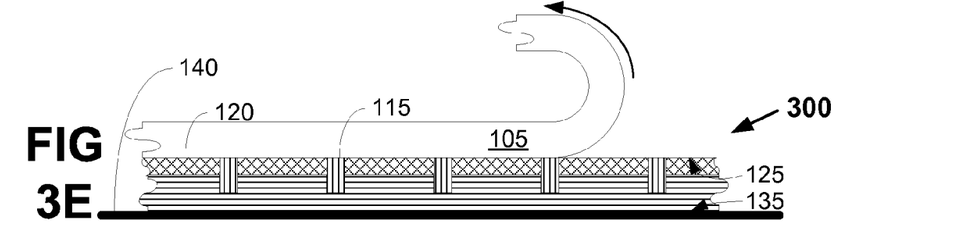

As depicted in FIG. 3E, the transfer film 105 is removed to expose the coplanar surface 125 formed by the low sheet resistance grid 115 and the nanostructure layer 120. In at least some instances, the transparent conductor 300 may be applied to the substrate 140 during the production process; for example, a flexible substrate 140 may be applied to the transparent conductor 300 using the reel-to-reel production process used to apply at least one of the low sheet resistance grid 115, the nanostructure layer 120, or the planarizing layer 130. The transfer film 105 can be released prior to or after the attachment of the transparent conductor 300 to a substrate 140. The transfer film 105 can be removed prior to or after the attachment of the transparent conductor 300 to a substrate 140. To minimize the likelihood of damage to the transparent conductor 300, the transfer film 105 may be removed after attaching or otherwise bonding the transparent conductor 300 to the substrate 140.

After removal of the transfer film 105, one or more final smoothing layers may be disposed on the coplanar surface 125 to provide additional functionality or to further protect the coplanar surface 125 from damage. Examples of smoothing layers can include, but are not limited to, a conducting polymer, an evaporated hole transport layer deposited per a hole transport pattern, an evaporated electron transport layer deposited per an electron transport pattern, an evaporated hole inhibition layer deposited per a hole inhibition pattern, an evaporated electron inhibition layer deposited per an electron inhibition pattern, an electron-blocking buffer layer, a hole-blocking buffer layer, and/or a conducting polymer having desirable charge carrier extracting or injecting properties. The one or more final smoothing layers may be uniformly applied, post-patterned, or pre-patterned.

Figure 3F:
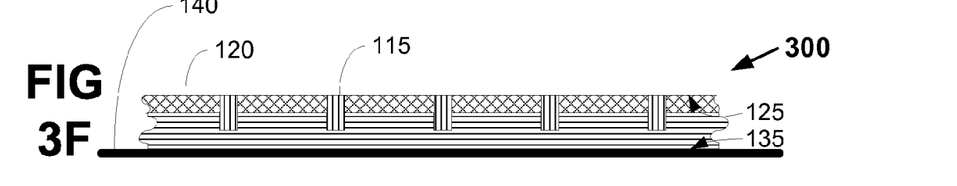

FIG. 3F depicts the transparent conductor 300, without transfer film 105, applied or otherwise bonded to a substrate 140 via the planarizing layer 130.

The substrate 140 can include any rigid or flexible material, for example a rigid glass or a flexible plastic substrate may be used. The substrate 140 may be an exterior surface of a larger device such as an OLED display device, and OLED lighting device or a photovoltaic device.

FIGS. 4A through 4G depict a transparent conductor 400 including a low sheet resistance grid 115, a nanostructure layer 120, at least one isolator 205, an planarizing layer 130, and a protective film 305. The inclusion of the at least one isolator 205 provides a plurality of electrically decoupled transparent conductor portions 400A, 400B, and 400C within a single transparent conductor 400.

The low sheet resistance grid 115, the nanostructure layer 120, and the at least one isolator 205 are at least partially deposited on the surface 110 of the transfer film 105. The low sheet resistance grid 115, the nanostructure layer 120, and the at least one isolator 205 collectively form the coplanar surface 410 of the transparent conductor 400. Being formed proximate the surface 110, the coplanar surface 410 has a surface roughness comparable to the surface roughness of the transfer film surface 110.

Figure 4A:
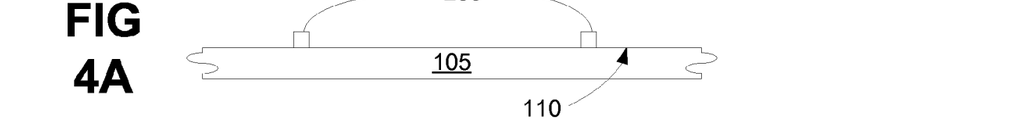
FIGS. 4A-4G depict a transparent conductor including an isolator, a low sheet resistance grid, a nanostructure layer, a planarizing layer, and a protective film according to an embodiment described herein.

As depicted in FIG. 4A, the at least one isolator 205 is deposited or otherwise disposed across all or a portion of the surface 110. In some instances, the at least one isolator 205 may be pre-patterned and disposed in final position using, for example, an ink-jet, screen, or similar printing technology. In other instances, the at least one isolator 205 may be post-patterned after being more or less uniformly deposited across all or a portion of the surface 110. Such post-patterning can use various techniques, for example photo-lithographic techniques, to provide any desired isolator pattern.

Figure 4B:
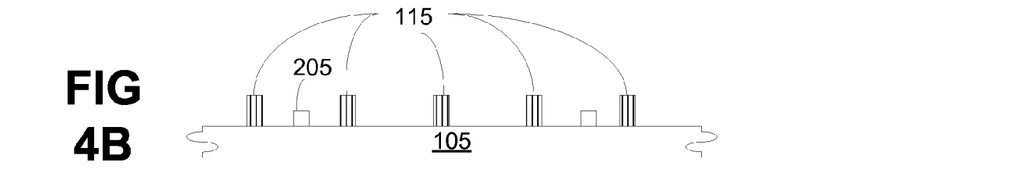

As depicted in FIG. 4B, the low sheet resistance grid 115 is deposited or otherwise disposed across all or a portion of the surface 110 and the at least one isolator 205. The low sheet resistance grid 115 may be pre-patterned and disposed in final position using, for example using screen printing or other similar printing technologies. In other instances, the low sheet resistance grid 115 may be post-patterned for example using photo-lithographic techniques after being more or less uniformly deposited across all or a portion of the surface 110 and the at least one isolator 205.

Figure 4C:
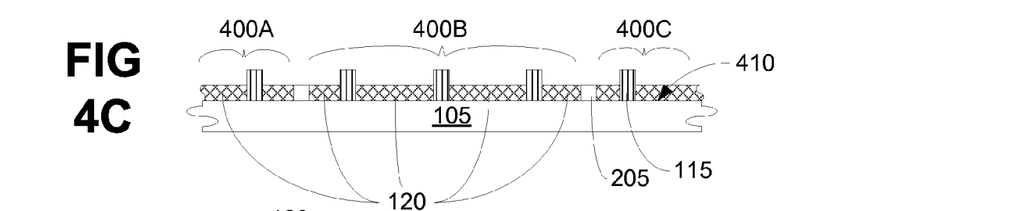

As depicted in FIG. 4C, a nanostructure layer 120 is deposited or otherwise disposed across all or a portion of the surface 110, the at least one isolator 205, and the low sheet resistance grid 115. The nanostructure layer 120 may be selectively electrically coupled to the low sheet resistance grid based upon the number and location of the at least one isolator 205. In some embodiments, the at least one isolator 205 can apportion the transparent conductor in whole or in part to provide the plurality of electrically decoupled transparent conductors 400A, 400B and 400C.

The nanostructure layer 120 may be pre-patterned and disposed in final position using, for example, an ink-jet or similar printing technology. The one or more isolators 205, the low sheet resistance grid 115 and the nanostructure layer 120 collectively form a coplanar surface 410 proximate to the surface 110 of the transfer film 105. Deposition of the one or more isolators 205, the low sheet resistance grid 115 and the nanostructure layer 120 in a manner that promotes continuous or near continuous physical and/or electrical contact between the constituent components can produce a transparent conductor 400 that, after release from the transfer film 105, provides a coplanar surface 410 which has a surface roughness approximately equal to the surface 110.

Physically bonding the low sheet resistance grid 115 with the nanostructure layer 120 improves the mechanical properties of the transparent conductor 400. For example, the transparent conductor 400 is less brittle and less likely to crack when compared to transparent conductive oxides such as ITO and AZO. The improved mechanical properties of the transparent conductor 200 facilitates its use in the production of large scale transparent conductors such as those found in large scale OLED display devices, OLED lighting devices and photovoltaic devices. The surface roughness of the coplanar surface 410 formed by the at least one isolator 205, the low sheet resistance grid 115 and the nanostructure layer 120 can be about 50 nm peak-to-peak or less; about 30 nm peak-to-peak or less; or about 10 nm peak-to-peak or less. A transparent conductor 400 having a low surface roughness minimizes the losses attributable to the presence of internal shorting or leakage currents within the end use device such as OLED or photovoltaic devices. Electrically coupling the low sheet resistance grid 115 with the nanostructure layer 120 provides a transparent conductor 400 having a sheet resistance of less than about 10 ohms/sq; less than about 5 ohms/sq; less than about 1 ohms/sq; or less than about 0.1 ohms/sq.

Figure 4D:
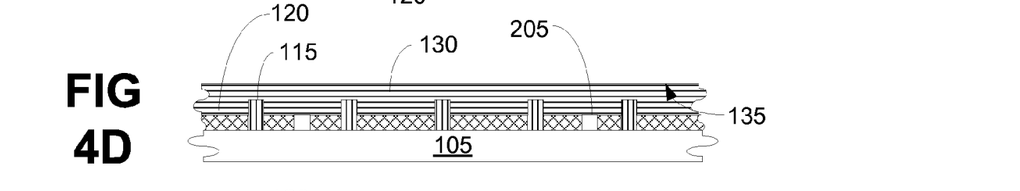

As depicted in FIG. 4D, a planarizing layer 130 is deposited across all or a portion of the surface formed by the at least one isolator 205, the low sheet resistance grid 115 and the nanostructure layer 120. In some instances, the planarizing layer 130 can be pre-patterned, for example to "fill" low spots on the sometimes rough or irregular surface formed by the at least one isolator 205, the low sheet resistance grid 115 and the nanostructure layer 120. In other instances, for example as depicted in FIG. 4D, the planarizing layer 130 can be applied in a non-uniform manner partially or completely across the surface formed by the at least one isolator 205, the low sheet resistance grid 115 and the nanostructure layer 120 to provide a planar surface 135.

Figure 4E:
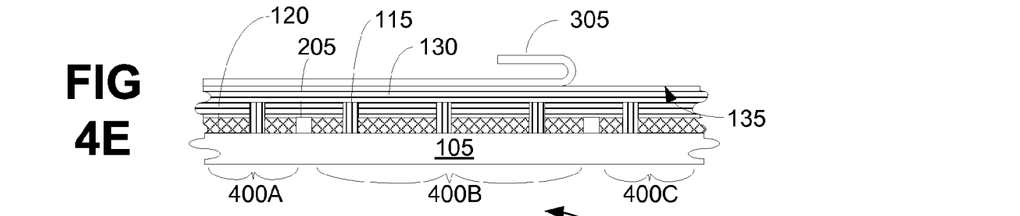

As depicted in FIG. 4E, a protective film 305 can be disposed across all or a portion of the exposed surface 135 of the planarizing layer 130. The protective film 305 can maintain the integrity and/or smoothness of the planarizing layer surface 135 until the transparent conductor 400 is applied to a substrate 140.

Figure 4F:
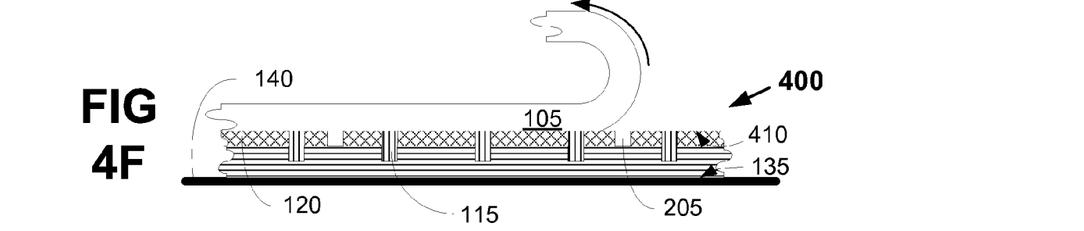

In FIG. 4F the transfer film 105 is removed to expose the coplanar surface 410 formed by the low sheet resistance grid 115, the nanostructure layer 120, and the at least one isolator 205. In at least some instances, the transparent conductor 400 may be applied to the substrate 140 during the production process; for example, a flexible substrate 140 may be applied to the transparent conductor 400 using the reel-to-reel production process used to apply at least one of the at least one isolators 205, the low sheet resistance grid 115, the nanostructure layer 120, or the planarizing layer 130. The transfer film 105 can be released prior to or after the attachment of the transparent conductor 400 to a substrate 140. To minimize the likelihood of damage to the transparent conductor 400, the transfer film may be released after attaching the transparent conductor 400 to the substrate 140.

After removal of the transfer film 105, one or more final smoothing layers may be disposed on the coplanar surface 410 to provide additional functionality or to further protect the coplanar surface 410 from damage. Examples of smoothing layers can include, but are not limited to, a conducting polymer, an evaporated hole transport layer deposited per a hole transport pattern, an evaporated electron transport layer deposited per an electron transport pattern, an evaporated hole inhibition layer deposited per a hole inhibition pattern, an evaporated electron inhibition layer deposited per an electron inhibition pattern, an electron-blocking buffer layer, a hole-blocking buffer layer, and/or a conducting polymer having desirable charge carrier extracting or injecting properties. The one or more final smoothing layers may be uniformly applied, post-patterned, or pre-patterned.

Figure 4G:
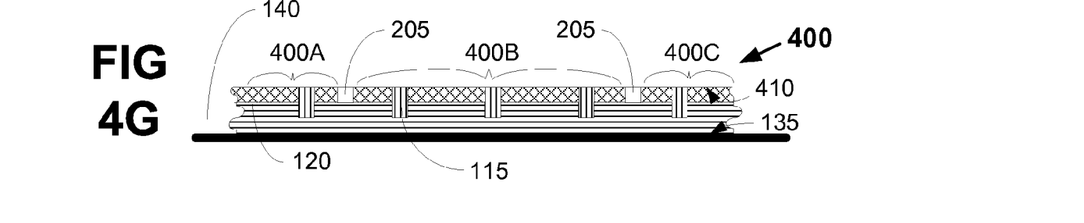

FIG. 4G, depicts the transparent conductor 400, without transfer film 105, applied or otherwise bonded to substrate 140 via an adhesive forming all or a portion of the planarizing layer 130. The substrate 140 can include any rigid or flexible material, for example a rigid glass or a flexible plastic substrate may be used. The substrate 140 may be an exterior surface of a larger device such as an OLED display device, an OLED lighting device or a photovoltaic device.

The disposal of the at least one isolator 205 proximate the transfer film 105 reduces or eliminates the need for post-process placement of the isolators 205 via cutting or ablation of the coplanar surface 410 of the transparent conductor 400. Minimizing or eliminating the need for open channel type isolators cut into the coplanar surface 410 of the transparent conductor 400 maintains the integrity of the coplanar surface 410.

FIGS. 5A through 5F depict a transparent conductor 500 including a low sheet resistance grid 115, a nanostructure layer 120, and a planarizing layer 130 at least partially covered by a protective film 305 according to an embodiment. The low sheet resistance grid 115, nanostructure layer 120, and planarizing layer 130 forming the transparent conductor 500 are at least partially deposited on the surface 110 of the transfer film 105. The nanostructure layer 120 forms the planar surface 510 of the transparent conductor 500. Being formed proximate the surface 110, the planar surface 510 has a surface roughness comparable to the surface roughness of the transfer film surface 110. One or more additional layers may be combined or otherwise applied with the nanostructure layer 120, these layers include, but are not limited to one or more smoothing layers, one or more electron or hole blocking layers, one or more electron or hole injecting layers, or combinations thereof.

Figure 5A:
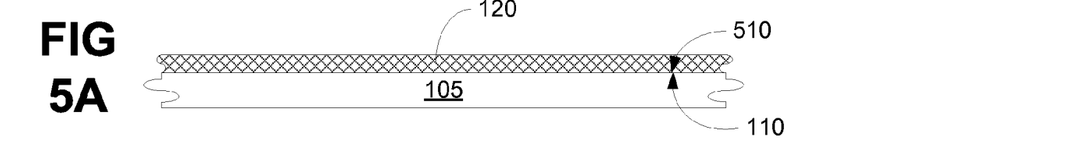
FIGS. 5A-5F depict a transparent conductor including a low sheet resistance grid, a nanostructure layer, a planarizing layer, and a protective film according to an embodiment described herein.

As depicted in FIG. 5A a nanostructure layer 120 may be deposited or otherwise disposed across all or a portion of the surface 110 of the transfer film 105. In some instances, the nanostructure layer 120 may be pre-patterned and disposed in final position using, for example using gravure printing, flexo printing, or other similar printing technologies. In other instances, the nanostructure layer 120 may be post-patterned for example using photo-lithographic techniques after being more or less uniformly deposited across all or a portion of the surface 110 of the transfer film 105. Application of the nanostructure layer 120 in a manner promoting continuous or near continuous physical contact between the nanostructure layer 120 and transfer film 105 produces, after release from the transfer film 105, the planar surface 510 with a roughness approximately equal to the surface roughness of the surface 110.

Figure 5B:
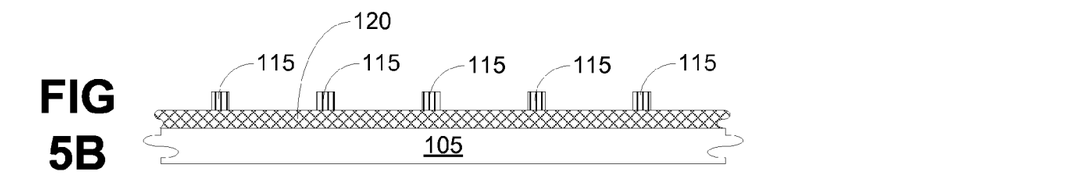

As depicted in FIG. 5B the low sheet resistance grid 115 is deposited or otherwise disposed across all or a portion of the nanostructure layer 120. After deposition, all or a portion of the low sheet resistance grid 115 may be electrically coupled to the nanostructure layer 120. In some instances, the low sheet resistance grid 115 may be pre-patterned and disposed in final position using, for example using screen printing or similar printing technologies. In other instances, the low sheet resistance grid 115 may be post-patterned for example using photo-lithographic techniques after being more or less uniformly deposited across all or a portion of the nanostructure layer 120.

Physically bonding the low sheet resistance grid 115 with the nanostructure layer 120 improves the mechanical properties of the resultant transparent conductor 500. For example, the transparent conductor 500 is less brittle and less likely to crack when compared to transparent conductive oxides such as ITO and AZO. The improved mechanical properties of the transparent conductor 500 facilitates its use in the production of large scale transparent conductors such as those found in large scale OLED display devices, OLED lighting devices and photovoltaic devices. The surface roughness of the planar surface 510 formed by the nanostructure layer 120 can be about 50 nm peak-to-peak or less; about 30 nm peak-to-peak or less; or about 10 nm peak-to-peak or less. A transparent conductor 500 having a low surface roughness can minimize the losses attributable to the presence of internal shorting or leakage currents within the transparent conductor 500. Electrically coupling the low sheet resistance grid 115 and nanostructure layer 120 by depositing the low sheet resistance grid 115 on top of the nanostructure layer 120 provides a transparent conductor 500 having a sheet resistance of less than about 10 ohms/sq; less than about 5 ohms/sq; less than about 1 ohms/sq; or less than about 0.1 ohms/sq.

Figure 5C:
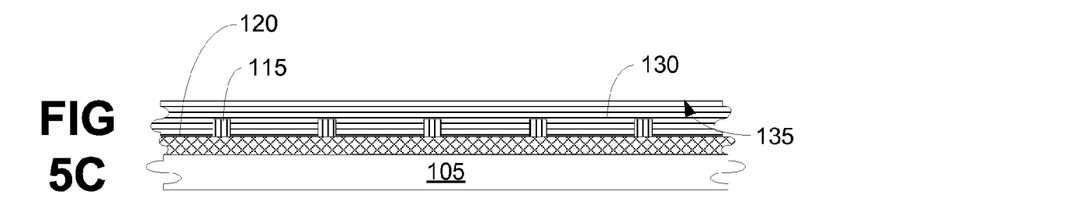

As depicted in FIG. 5C, an planarizing layer 130 can be deposited or otherwise disposed across all or a portion of the surface formed by the low sheet resistance grid 115 and the nanostructure layer 120. In some instances, the planarizing layer 130 can be pre-patterned, for example to "fill" low spots on the sometimes rough or irregular surface formed by the low sheet resistance grid 115 and the nanostructure layer 120. In other instances, for example as depicted in FIG. 5C, the planarizing layer 130 can be applied non-uniformly across the surface formed by the low sheet resistance grid 115 and the nanostructure layer 120 to provide a smooth or planar surface 135.

Figure 5D:
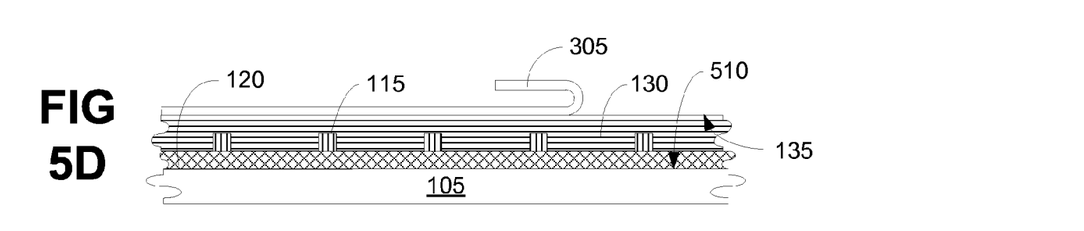

As depicted in FIG. 5D, a protective film 305 can be disposed across all or a portion of the exposed surface 135 of the planarizing layer 130. The protective film 305 can maintain the integrity and/or smoothness of the planarizing layer surface 135 until the transparent conductor 500 is applied to a substrate 140.

Figure 5E:
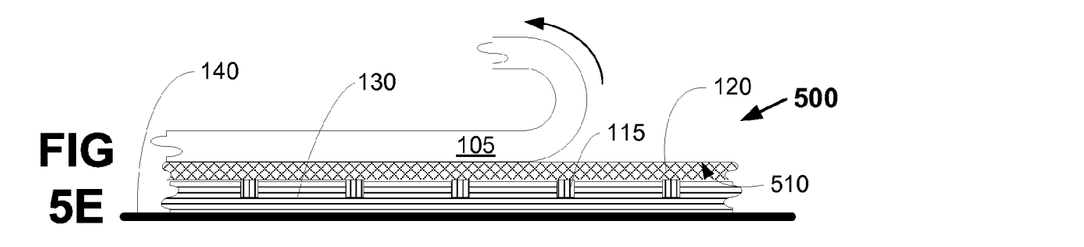

As depicted in FIG. 5E, the transfer film 105 is released to expose the planar surface 510 of the nanostructure layer 120. The transfer film 105 can be released prior to or after the attachment of the transparent conductor 500 to a substrate 140. To minimize the likelihood of damage to the transparent conductor 500, the transfer film may be released after attaching or otherwise bonding the transparent conductor 500 to the substrate 140.

In at least some instances, the transparent conductor 500 may be applied to the substrate 140 during the production process; for example, a flexible substrate 140 may be applied to the transparent conductor 500 using the reel-to-reel production process used to apply at least one of the low sheet resistance grid 115, the nanostructure layer 120, or the planarizing layer 130.

After release of the transfer film 105, one or more final smoothing layers may be disposed on the planar surface 510 to provide additional functionality or to further protect the planar surface 510 from damage. Examples of smoothing layers can include, but are not limited to, a conducting polymer, an evaporated hole transport layer deposited per a hole transport pattern, an evaporated electron transport layer deposited per an electron transport pattern, an evaporated hole inhibition layer deposited per a hole inhibition pattern, an evaporated electron inhibition layer deposited per an electron inhibition pattern, an electron-blocking buffer layer, a hole-blocking buffer layer, and/or a conducting polymer having desirable charge carrier extracting or injecting properties. The one or more final smoothing layers may be uniformly applied, post-patterned, or pre-patterned.

Figure 5F:
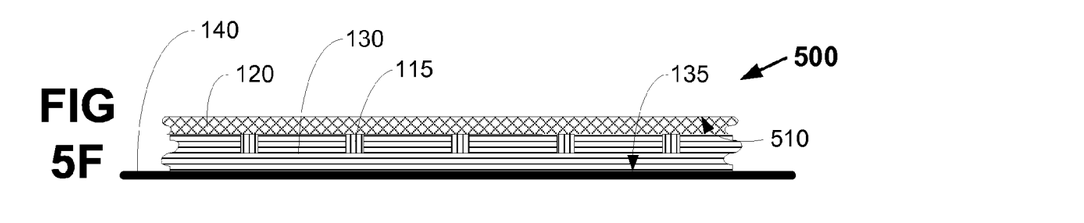

FIG. 5F depicts the transparent conductor 500, without transfer film 105, applied or otherwise bonded to a substrate 140 via an adhesive forming at least a portion of the planarizing layer 130. The substrate 140 can include any rigid or flexible material, for example a rigid glass or a flexible plastic substrate may be used. The substrate 140 may be an exterior surface of a larger device such as an OLED display device, and OLED lighting device or a photovoltaic device.

FIGS. 6A through 6G depict a transparent conductor 600 including a low sheet resistance grid 115, a nanostructure layer 120, at least one isolator 205, a planarizing layer 130, and a protective film 305. The inclusion of the at least one isolator 205 provides a plurality of electrically decoupled transparent conductors 600A, 600B, and 600C disposed within a single transparent conductor 600.

The nanostructure layer 120 and the at least one isolator 205 are at least partially deposited on the surface 110 of the transfer film 105. The nanostructure layer 120 and the at least one isolator 205 collectively form the planar surface 610 of the transparent conductor 600. Being formed proximate the surface 110, the planar surface 610 has a surface roughness comparable to the surface roughness of the transfer film surface 110.

Figure 6A:
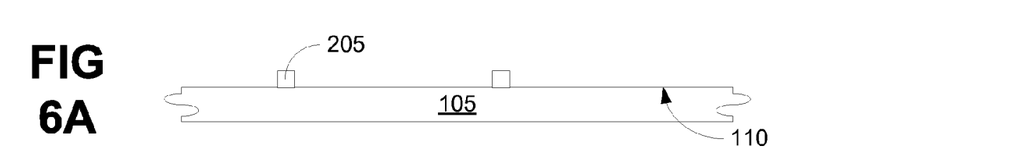
FIGS. 6A-6G depict a transparent conductor including an isolator, a low sheet resistance grid, a nanostructure layer, a planarizing layer, and a protective film according to an embodiment described herein.

As depicted in FIG. 6A, the at least one isolator 205 is deposited or otherwise disposed across all or a portion of the surface 110. In some instances, the at least one isolator 205 may be pre-patterned and disposed in final position using, for example, an ink-jet, screen, or similar printing technology. In other instances, the at least one isolator 205 may be post-patterned after being more or less uniformly deposited across all or a portion of the surface 110. Such post-patterning can use various techniques, for example photolithographic techniques, to provide any desired isolator pattern.

Figure 6B:
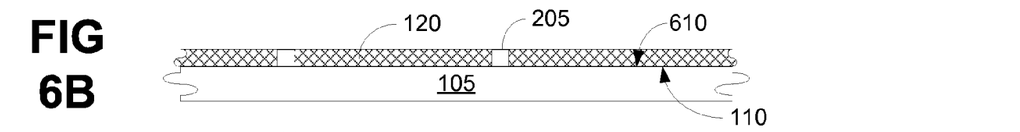

As depicted in FIG. 6B, the nanostructure layer 120 is deposited or otherwise disposed across all or a portion of the surface 110 and the at least one isolator 205. The nanostructure layer 120 may be pre-patterned and disposed in final position using, for example using gravure printing, flexo printing or other similar printing technologies. In some embodiments, the at least one isolator 205 can divide the transparent conductor 600 in whole or in part to provide the plurality of electrically decoupled transparent conductors 600A, 600B, 600C.

The one or more isolators 205 and the nanostructure layer 120 collectively form a surface 610 proximate the surface 110 of the transfer film 105. Deposition of the one or more isolators 205 and the nanostructure layer 120 in a manner that promotes continuous or near continuous physical and/or electrical contact between the constituent components can produce a transparent conductor 600 that, after release from the transfer film 105, has a planar surface 610 with a surface roughness approximately equal to the transfer film surface 110.

Figure 6C:
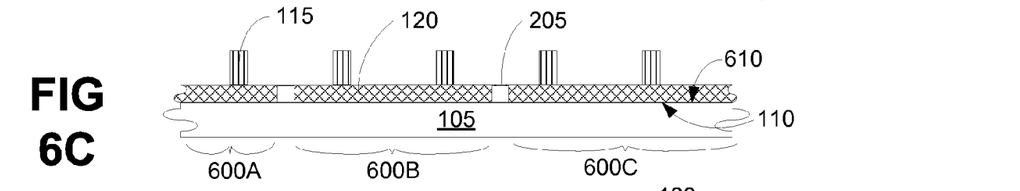

As depicted in FIG. 6C, the low sheet resistance grid 115 is deposited or otherwise disposed across all or a portion of the surface formed by the nanostructure layer 120 and the at least one isolator 205. The low sheet resistance grid 115 may be pre-patterned and disposed in final position using, for example using screen printing or other similar printing technologies. In other instances, the low sheet resistance grid 115 may be post-patterned for example using photolithographic techniques after being more or less uniformly deposited across all or a portion of the surface formed by the nanostructure layer 120 and the at least one isolator 205. The low sheet resistance grid 115 is physically and electrically coupled to all or a portion of the nanostructure layer 120.

Physically bonding the low sheet resistance grid 115 with the nanostructure layer 120 improves the mechanical properties of the transparent conductor 600. For example, the transparent conductor 600 is less brittle and less likely to crack when compared to transparent conductive oxides such as ITO and AZO. The improved mechanical properties of the transparent conductor 600 facilitates its use in the production of large scale transparent conductors such as those found in large scale OLED display devices, OLED lighting devices and photovoltaic devices. The surface roughness of the coplanar surface 125 formed by the at least one isolator 205, the low sheet resistance grid 115 and the nanostructure layer 120 can be about 50 nm peak-to-peak or less; about 30 nm peak-to-peak or less; or about 10 nm peak-to-peak or less. A transparent conductor 600 having a low surface roughness minimizes the losses attributable to the presence of internal shorting or leakage currents within the transparent conductor 600. Electrically coupling the low sheet resistance grid 115 with the nanostructure layer 120 provides a transparent conductor 600 having a sheet resistance of less than about 10 ohms/sq; less than about 5 ohms/sq; less than about 1 ohms/sq; or less than about 0.1 ohms/sq.

Figure 6D:
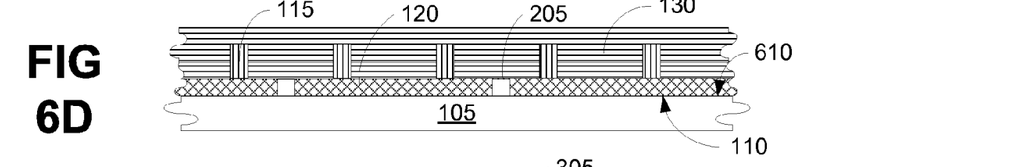

As depicted in FIG. 6D, a planarizing layer 130 is deposited across all or a portion of the surface formed by the at least one isolator 205, the low sheet resistance grid 115 and the nanostructure layer 120. In some instances, the planarizing layer 130 can be pre-patterned, for example to "fill" low spots on the sometimes rough or irregular surface formed by the at least one isolator 205, the low sheet resistance grid 115 and the nanostructure layer 120. In other instances, for example as depicted in FIG. 6D, the planarizing layer 130 can be applied in a non-uniform manner partially or completely across the surface formed by the at least one isolator 205, the low sheet resistance grid 115 and the nanostructure layer 120 to provide a planar surface 135.

Figure 6E:
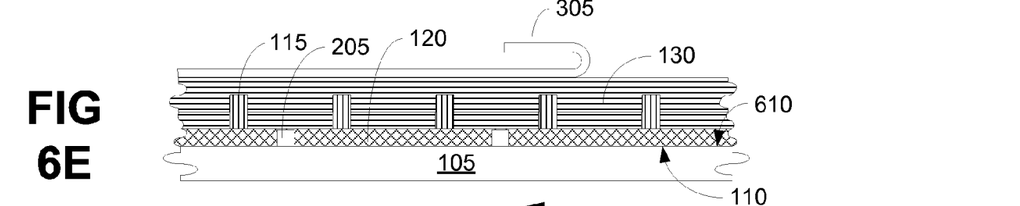

As depicted in FIG. 6E, a protective film 305 can be disposed across all or a portion of the exposed surface 135 of the planarizing layer 130. The protective film 305 can maintain the integrity and/or smoothness of the planarizing layer surface 135 until the transparent conductor 600 is applied to a substrate 140.

Figure 6F:
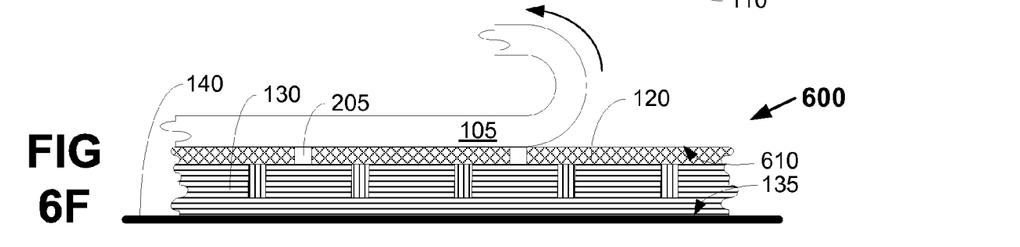

In FIG. 6F the transfer film 105 is released to expose the planar surface 610 provided by the nanostructure layer 120 and the one or more isolators 205. The transfer film 105 can be released prior to or after the attachment of the transparent conductor 600 to a substrate 140. To minimize the likelihood of damage to the transparent conductor 600, the transfer film may be released after attaching the transparent conductor 600 to the substrate 140. After release of the transfer film, one or more additional layers may be disposed on the planar surface 610 provided by the nanostructure layer 120 and the one or more isolators 205 to provide additional functionality or to further protect the planar surface 610 of the transparent conductor 600 from damage.

In at least some instances, the transparent conductor 600 may be applied to the substrate 140 during the production process; for example, a flexible substrate 140 may be applied to the transparent conductor 600 using the reel-to-reel production process used to apply at least one of the at least one isolator 205, the low sheet resistance grid 115, the nanostructure layer 120, or the planarizing layer 130.

After release of the transfer film 105, one or more final smoothing layers may be disposed on the planar surface 610 to provide additional functionality or to further protect the planar surface 610 from damage. Examples of smoothing layers can include, but are not limited to, a conducting polymer, an evaporated hole transport layer deposited per a hole transport pattern, an evaporated electron transport layer deposited per an electron transport pattern, an evaporated hole inhibition layer deposited per a hole inhibition pattern, an evaporated electron inhibition layer deposited per an electron inhibition pattern, an electron-blocking buffer layer, a hole-blocking buffer layer, and/or a conducting polymer having desirable charge carrier extracting or injecting properties. The one or more final smoothing layers may be uniformly applied, post-patterned, or pre-patterned.

Figure 6G:
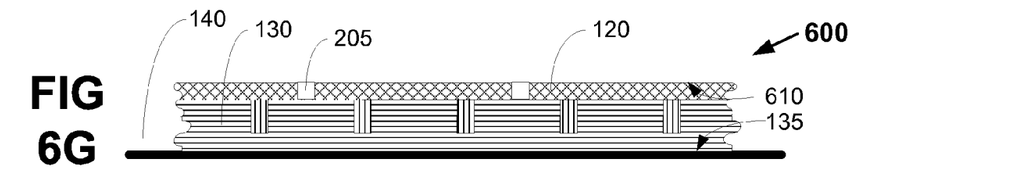

FIG. 6G, depicts the transparent conductor 600, without transfer film 105, applied or otherwise bonded to substrate 140 via an adhesive forming at least a portion of the planarizing layer 130. The substrate 140 can include any rigid or flexible material, for example a rigid glass or a flexible plastic substrate may be used. The substrate 140 may be an exterior surface of a larger device such as an OLED display device, an OLED lighting device or a photovoltaic device.

The disposal of the at least one isolator 205 proximate the transfer film 105 reduces or eliminates the need for post-process placement of the isolators 205 via cutting or ablation of the planar surface 610 of the transparent conductor 600. Minimizing or eliminating the need for open channel type isolators cut into the planar surface 610 of the transparent conductor 600 maintains the integrity of the planar surface 610.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
providing a transfer film having a transfer film surface;
forming a low sheet resistance grid on the transfer film surface according to a grid pattern;
forming a nanostructure layer on the transfer film surface; and
forming at least one isolation structure on the transfer film surface according to an isolation pattern, the at least one isolation structure patterning the transparent conductor into a plurality of electrically isolated structures;
wherein the low sheet resistance grid and the nanostructure layer form at least one coplanar transparent conductor surface.

2. The method of claim 1 wherein forming the nanostructure layer on the transfer film surface comprises forming the nanostructure layer on the transfer film surface according to a nanostructure layer pattern.

3. The method of claim 2 wherein forming the nanostructure layer on the transfer film surface according to a nanostructure layer pattern comprises direct printing a nanostructure layer on the transfer film surface.

4. The method of claim 1, further comprising:
exposing the coplanar transparent conductor surface formed by the low sheet resistance grid and the nanostructure layer by removing the transfer film.

5. The method of claim 1 wherein forming the low sheet resistance grid on the transfer film surface according to the grid pattern comprises an overall deposition of a conductive metal followed by a removal via post-patterning of at least a portion of the deposited metal.

6. The method of claim 1 wherein the nanostructure layer comprises a plurality of conductive metallic nanowires dispersed within a polymer matrix.

7. The method of claim 1 wherein the nanostructure layer comprises a plurality of light-scattering particles.

8. The method of claim 1 wherein the nanostructure layer comprises a plurality of light-directing structures.

9. The method of claim 1 wherein the low sheet resistance grid and the nanostructure layer have a sheet resistance of less than about 5 ohms/sq.

10. The method of claim 1 wherein the low sheet resistance grid and the nanostructure layer have a sheet resistance of less than about 0.1 ohm/sq.

11. The method of claim 1, further comprising:
forming a layer proximate the nanostructure layer, the layer including at least one layer selected from the group consisting of: a smoothing layer, a hole transport layer, a hole injection layer, an electron transport layer, and an electron injection layer.

12. A method, comprising:
providing a transfer film having a transfer film surface;
forming a low sheet resistance grid on the transfer film surface according to a grid pattern; and
forming a nanostructure layer on the transfer film surface;
wherein the low sheet resistance grid and the nanostructure layer form at least one coplanar transparent conductor surface, and wherein
the transfer film surface has a surface roughness of less than 50 nanometers peak-to-peak; and
the coplanar transparent conductor surface has a surface roughness of less than 50 nanometers peak-to-peak.

13. The method of claim 1 wherein
the transfer film surface has a surface roughness of less than 50 nanometers peak-to-peak; and
the coplanar transparent conductor surface and the at least one isolation structure forming a coplanar surface having a surface roughness of less than 50 nanometers peak-to-peak.

14. The method of claim 1, further comprising:
forming an planarizing layer at least partially on the low sheet resistance grid and nanostructure layer opposite the transfer film surface.

15. The method of claim 14 wherein forming the planarizing layer comprises depositing the planarizing layer according to a planarizing layer pattern.

16. The method of claim 14 wherein the planarizing layer comprises an adhesive material.

17. The method of claim 14 wherein the planarizing layer comprises a material to smoothen a surface formed by the low sheet resistance grid and the nanostructure layer opposite the transfer film.

18. The method of claim 14, further comprising affixing the transparent conductor to a substrate via the planarizing layer.

19. The method of claim 14, further comprising:
removing a protective film layer disposed on the planarizing layer; and
affixing the transparent conductor to a substrate.

* * * * *